United States Patent
Young

(10) Patent No.: US 7,459,787 B2
(45) Date of Patent: Dec. 2, 2008

(54) MULTI-LAYERED COPPER LINE STRUCTURE OF SEMICONDUCTOR DEVICE AND METHOD FOR FORMING THE SAME

(75) Inventor: Lee Tae Young, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 227 days.

(21) Appl. No.: 11/433,037

(22) Filed: May 12, 2006

(65) Prior Publication Data

US 2006/0258151 A1 Nov. 16, 2006

(30) Foreign Application Priority Data

May 13, 2005 (KR) .................. 10-2005-0040111

(51) Int. Cl.
*H01L 29/861* (2006.01)
*H01L 21/4763* (2006.01)

(52) U.S. Cl. .............. 257/758; 257/762; 257/773; 438/624; 438/637; 438/687

(58) Field of Classification Search .............. 438/624, 438/626, 627, 637, 638, 687; 257/758, 762, 257/773, 774, 750, 752
See application file for complete search history.

(56) References Cited

U.S. PATENT DOCUMENTS

| | | | |
|---|---|---|---|
| 6,468,894 B1 * | 10/2002 | Yang et al. | 438/622 |
| 2003/0116852 A1 * | 6/2003 | Watanabe et al. | 257/758 |
| 2005/0136650 A1 * | 6/2005 | Tsuchida | 438/637 |
| 2005/0142840 A1 * | 6/2005 | Fujimaki | 438/622 |
| 2007/0093057 A1 * | 4/2007 | Chen et al. | 438/683 |

* cited by examiner

*Primary Examiner*—Kevin M Picardat
(74) *Attorney, Agent, or Firm*—Saliwanchik, Lloyd & Saliwanchik

(57) ABSTRACT

A multi-layered copper line structure of a semiconductor device with a lower copper line, an upper copper line, and a via contact, which electrically connects the lower copper line and the upper copper line, can incorporate one or more dummy via contacts to reduce the occurrence of voids in the via contacts. The one or more dummy via contacts can be formed adjacent the via contact and non-electrically connected to the lower copper line.

18 Claims, 5 Drawing Sheets

MULTI-LAYERED COPPER LINE STRUCTURE OF SEMICONDUCTOR DEVICE AND METHOD FOR FORMING THE SAME

CROSS-REFERENCE TO RELATED APPLICATIONS

The present application claims the benefit of Korean patent application No. 10-2005-0040111, filed May 13, 2005, which is hereby incorporated by reference herein in its entirety.

BACKGROUND OF THE INVENTION

1. Field of the Invention

The present invention relates to a metal line of a semiconductor memory device, and more particularly, to a multi-layered copper line structure with a dummy via contact and a method for forming the same.

2. Description of the Related Art

As the integration of semiconductor devices is increasing, the width and thickness of metal lines are scaled down. The scaled-down width and thickness causes an increase of resistance, resulting in the decrease of a signal propagation speed. Also, a reduced sectional area of the line can cause a large current density, causing a severe electromigration (EM) of the line. As the size of the semiconductor device becomes submicron or less, this phenomenon occurs more often, so that the performance and reliability of metal lines formed of aluminum are greatly degraded.

To solve this problem of the aluminum line, many studies on a copper line have been actively made in recent years. The copper line also has many technical problems to be solved. One of them are voids causing open circuits of the line due to migration of a line material.

A line breakage phenomenon due to electromigration occurs in the copper line less often than in the aluminum line. However, the electromigration is still one of the important factors affecting the reliability of the copper line. In addition, materials of the copper line can migrate due to stress. This phenomenon is known as stress-induced migration (SM). When no current flows due to the decreased line width, a stress is applied to the line due to difference of thermal expansion coefficients between metal and substrate material or insulating material. This stress causes void in the line, resulting in the open circuit of the line.

The void and open circuit formed by the migration of copper atoms due to the electromigration or stress-induced migration generally occur around via contacts that connect a lower copper line to an upper copper line.

Specifically, when the length of the metal line is long, that is, when a distance between the via contacts is long, these defects occur more often.

FIG. 1 is a plan view of a related art multi-layered copper line structure, and FIG. 2A is a sectional view taken along line II-II of FIG. 1.

Referring to FIGS. 1 and 2A, a lower copper line 12 and an upper copper line 16 formed on a substrate 10 are electrically connected together by a via contact 15.

The lower copper line 12, the via contact 15, and the upper copper line 16 are formed in a first interlayer insulating layer 11, a second interlayer insulating layer 13, and a third interlayer insulating layer 14, respectively.

In the case of an aluminum line, the via contact is formed of a material (e.g., tungsten) other than aluminum. However, in the case of a copper line, a damascene process is used. Therefore, the via contact is also formed of copper. Therefore, the void and open circuit due to the migration of copper atoms occurs more often around the via contact 15, which has a relatively smaller volume than the lower copper line 12 and the upper copper line 16.

Specifically, as the length of the copper line 16 is lengthened, the distance between the via contacts 15 are also lengthened so that the defect such as void often occurs in the via.

It can be seen from FIG. 2B that via pollution void can occur as the distance between the via contacts 15 is lengthened.

SUMMARY OF THE INVENTION

Accordingly, the present invention is directed to a multi-layered copper line structure and a method for forming the same that substantially obviate one or more problems due to limitations and disadvantages of the related art.

An object of the present invention is to provide a multi-layered copper line structure of a semiconductor device, capable of preventing voids and open circuits due to migration of copper atoms.

Additional features of certain embodiments of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve certain advantages in accordance with the purpose of the invention, as embodied and broadly described herein, there is provided a multi-layered copper line structure of a semiconductor device with a lower copper line and an upper copper line, including: a via contact formed between the lower copper line and the upper copper line to electrically connect the lower copper line and the upper copper line; and a dummy via contact formed adjacent to the via contact and non-electrically connected to the upper copper line.

In another aspect of the present invention, there is provided a method for forming a multi-layered copper line of a semiconductor device, including: forming a first interlayer insulating layer; forming a lower copper line within the first interlayer insulating layer; forming a second interlayer insulating layer on the first interlayer insulating layer and the lower copper line; forming at least one via contact and at least one dummy via contact within the second interlayer insulating layer; forming a third interlayer insulating layer on the second interlayer insulating layer; and forming an upper copper line within the third interlayer insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a multi-layered copper line structure of a semiconductor device and a method for forming the same according to the present invention will be described in detail with reference to the accompanying drawings.

Figure 1:
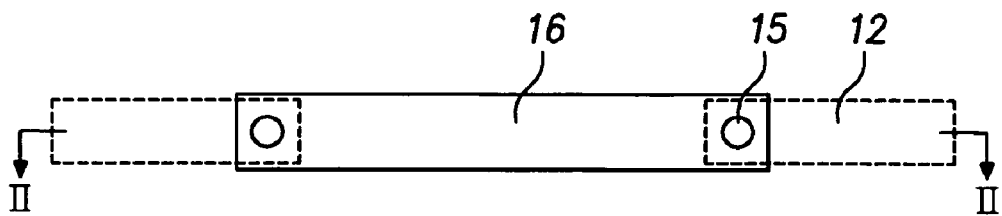
FIG. 1 is a plan view of a multi-layered copper line structure in a related art semiconductor device.
Figure 2A:
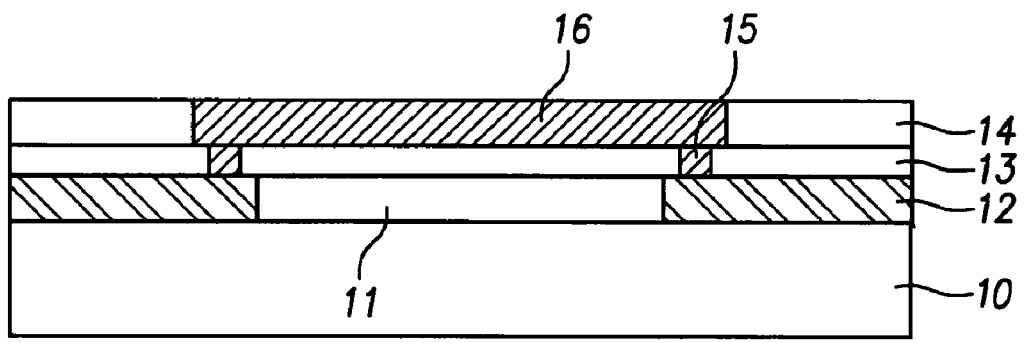
FIG. 2A is a sectional view taken along line II-II of FIG. 1.
Figure 2B:
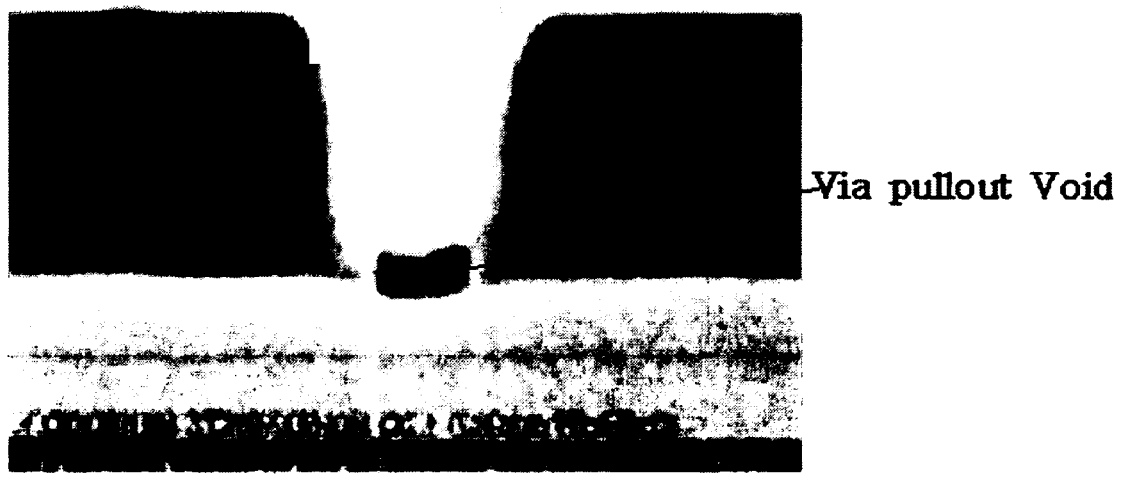
FIG. 2B is a photograph of the multi-layered copper line structure in the related art semiconductor device, showing a via pollution void.
Figure 3A:
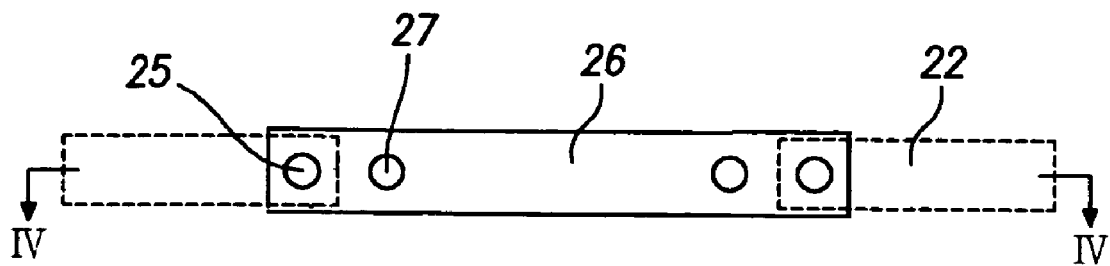
FIGS. 3A and 3B are plan views of a multi-layered copper line structure in a semiconductor device with a dummy via contact according to an embodiment of the present invention.
Figure 3B:
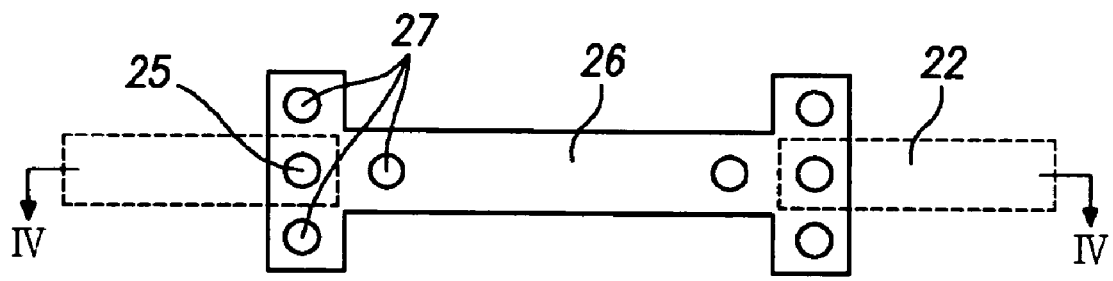
Figure 4:
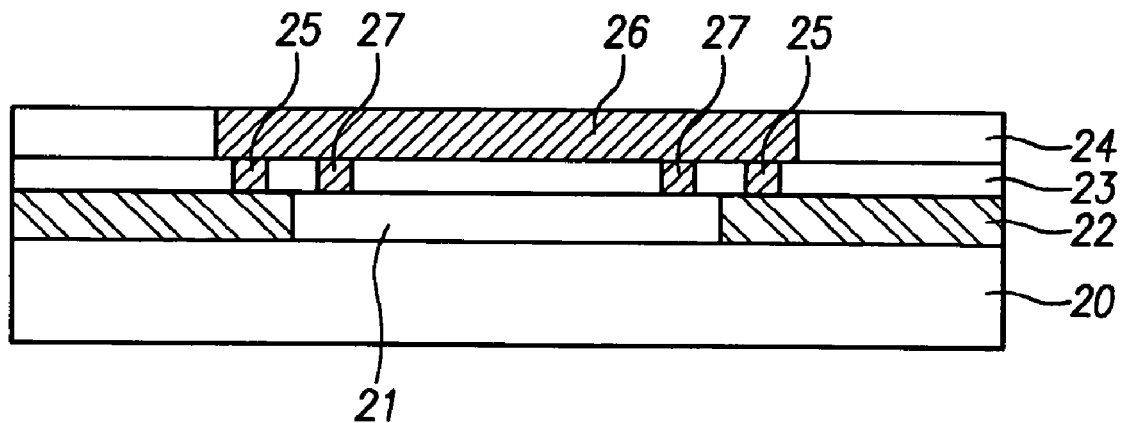
FIG. 4 is a sectional view taken along line IV-IV of FIGS. 3A and 3B.

FIGS. 3A and 3B are plan views of a multi-layered copper line structure in a semiconductor device with a dummy via contact according to embodiments of the present invention, and FIG. 4 is a sectional view taken along line IV-IV of FIGS. 3A and 3B.

In an embodiment of the present invention, one or more via contacts 25 can be formed to provide contact between a lower copper line 22 and an upper copper line 26. Referring to FIG. 3A, which shows a plan view of a multi-layered copper line structure in a semiconductor device according to a first embodiment of the present invention, a dummy contact 27 can be formed adjacent a via contact 25. In this embodiment, a via contact 25 may be provided in plurality. In a specific embodiment, the dummy contact 27 can be formed adjacent the via contact 25 such that the contacts 25, 27 form a line parallel to an upper copper line 26. In an embodiment, a plurality of dummy via contacts 27 can be formed between the via contacts 25 such that a line in which the dummy via contacts 27 are formed can be parallel to an upper copper line 26. Accordingly, as a distance between contacts decreases, the occurrence of void in the via contacts 25 can be remarkably reduced.

In an embodiment, a dummy via contact 27 can be formed at a location spaced apart from the via contact 25 by about 0.3 to about 0.5 μm. Accordingly, the occurrence of a void in the via contact can be remarkably reduced.

Referring to FIG. 3B, which shows a plan view of a multi-layered copper line structure in a semiconductor device according to a second embodiment of the present invention, a plurality of dummy contacts 27 can be formed adjacent a via contact 25. In this embodiment, via contacts 25 and dummy via contacts 27 can be provided in plurality.

The dummy via contacts 27 can be formed adjacent the via contact 25 such that the dummy via contacts 27 and the via contact 25 form a line parallel to an upper copper line 26 and a line perpendicular to the copper line 26. Accordingly, as a distance between contacts decreases, the occurrence of void in the via contacts 25 can be remarkably reduced.

Specifically, the dummy via contacts 27 which are formed around a via contact 25 can absorb the voids or impurities that would have formed in the via contact 25. Consequently, the occurrence of the voids or impurities in the via contact 25 can be remarkably reduced.

Referring again to FIGS. 3A, 3B and 4, a lower copper line 22 can be formed on a lower structure 20. The lower structure 20 can incorporate a transistor structure, another line structure, and/or other structures. The upper copper line 26 can be formed over the lower copper line 22. The upper copper line 26 and the lower copper line 22 are electrically connected together through the via contacts 25. The via contacts 25, the upper copper line 26, and the lower copper line 22 can be formed of copper. Although a method for forming the multi-layered copper line will be described later, the lower copper line 22, the via contacts 25, and the upper copper line 26 can be formed in a first interlayer insulating layer 21, a second interlayer insulating layer 23, and a third interlayer insulating layer 24, respectively.

According to the present invention, the multi-layered copper line structure includes one or more dummy via contacts 27. Like the via contact 25, the dummy via contact 27 can be formed of copper in the second interlayer insulating layer 23. However, unlike the via contact 25, which electrically connects the upper copper line 26 to the lower copper line 22, the dummy via contact 27 is connected to the upper copper line 26, but not to the lower copper line 22. As the dummy via contact 27 is formed adjacent the via contact, wherein the dummy via contact 27 is connected to the upper copper line but is not connected to the lower copper line, the dummy via contact 27 reduces the distance between the via contacts 25.

At least one dummy via contact 27 can be formed adjacent to a via contact 25. Although three dummy via contacts 27 adjacent to one via contact 25 in three directions are illustrated in FIG. 3B, the present invention is not limited to the number of the dummy via contacts 27 and their directions. However, at least one dummy via contact 27 should be formed. In addition, the dummy via contact 27 is preferably formed at a location in which a distance between the via contacts 25 can substantially decrease.

In this manner, if a dummy via contact 27 is further formed at a location adjacent to the via contact 25, the distance between the via contacts 25 decreases and thus the probability that the void will occur can be remarkably reduced. In other words, a dummy contact formed between via contacts reduces the distance between adjacent contacts.

As described in the related art, the void or open circuit problem is caused by migration of copper atoms, such as electron migration and stress-migration migration. As the distance between the via contacts 25 increases, the migration of copper atoms can severely occur. Often the void and the open circuit occurs in proportion to the distance between the via contacts 25.

Based on this idea, when the dummy via contact 27 that does not manage an electrical function is formed at a location adjacent to the via contact 25, the dummy via contact 27 reduces the distance between the via contacts 25, thereby reducing the possibility of the void occurrence.

Also, when two or more via contacts 25 are formed as shown in FIGS. 3A and 3B, the dummy via contact 27 can be formed closer to one of the two via contacts 25. In this manner, the void occurring around one via contact 25 can be concentrated around the dummy via contact 27 nearest that one via contact 25. Even if a void occurs, the void can be formed around the dummy via contact 27 rather than the via contact 25. Consequently, the occurrence of the void or impurities in the via contact 25 can be remarkably reduced.

A method for forming the multi-layered copper line structure will be described below in detail. Also, the following description will provide a further understanding of the multi-layered copper line structure.

FIGS. 5A to 5H are sectional views illustrating a method for forming the multi-layered copper line structure of the semiconductor device with the dummy via contact according to an embodiment of the present invention.

Figure 5A:
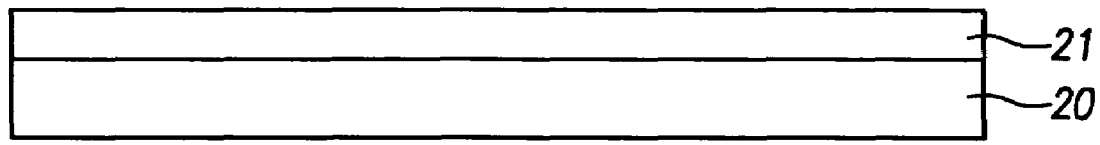
FIGS. 5A to 5H are sectional views illustrating a method for forming the multi-layered copper line structure of the semiconductor device with the dummy via contact according to an embodiment of the present invention.

Referring to FIG. 5A, a first interlayer insulating layer 21 is deposited on a lower structure 20. The first interlayer insulating layer 21 can be formed of silicon oxide. It is preferable that the first interlayer insulating layer 21 be formed of a material having a low dielectric constant so as to increase the operating speed of the semiconductor device. For example, the first interlayer insulating layer 21 can be formed of a fluorinated silica glass (FSG) having a dielectric constant of about 3.5 or less. Meanwhile, an etch stop layer (not shown) can be formed prior to the deposition of the first interlayer insulating layer 21.

Figure 5B:
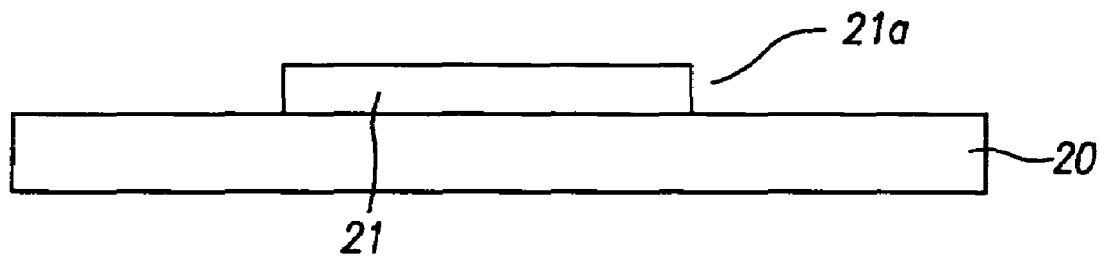

Referring to FIG. 5B, the first interlayer insulating layer 21 is selectively etched to form a first trench 21a within the first interlayer insulating layer 21. The first trench 21a is a region in which a lower copper line will be formed later.

Figure 5C:
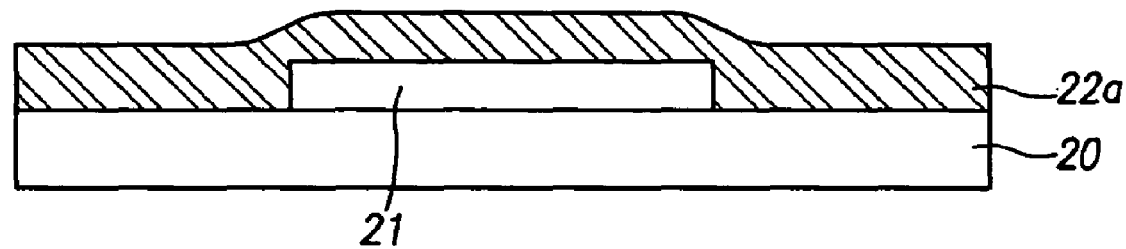

Referring to FIG. 5C, a first copper layer 22a is deposited to fill the first trench 21a. The first copper layer 22a can be deposited using electrolytic plating. Meanwhile, a diffusion barrier layer (not shown) and a copper seed layer (not shown) can be deposited prior to the deposition of the first copper layer 22a. Also, a thermal treatment can be performed after the deposition of the first copper layer 22a. The diffusion barrier layer can prevent copper from being diffused into the interlayer insulating layer. Due to the copper seed layer, the first copper layer 22a can be effectively formed.

In an embodiment, the thermal treatment is performed in vacuum atmosphere to reflow the resulting structure in which the first copper layer 22a is formed. For this purpose, the thermal treatment is performed on the resulting structure at about 350 to about 600° C. for several seconds to tens of minutes, preferably for about 30-180 seconds, under an inert gas atmosphere (for example Ar) in the vacuum atmosphere. The thermal treatment for the reflow should be performed in a state in which a surface oxidation of the first copper layer 22a is maximally suppressed. Accordingly, it is preferable that the thermal treatment be performed in a high vacuum of about 10 torr or less, preferably about 10 to about 6 torr or less. When the thermal treatment is performed on the resulting structure with the first copper layer 22a in the above-described condition, the metal layers move due to the reflow so that the first trench 21a is completely filled.

The thermal treatment can be performed after the first copper layer 22a is planarized using a chemical mechanical polishing (CMP) process. As a result of the thermal treatment, it is possible to obtain a completely-planarized lower metal line 22.

Figure 5D:
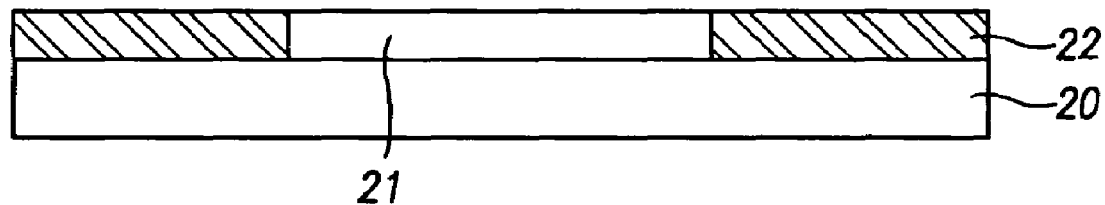

Referring to FIG. 5D, the first copper layer 22a can be planarized using a CMP process to form a lower copper line 22 within the first trench 21a of the first interlayer insulating layer 21.

Figure 5E:
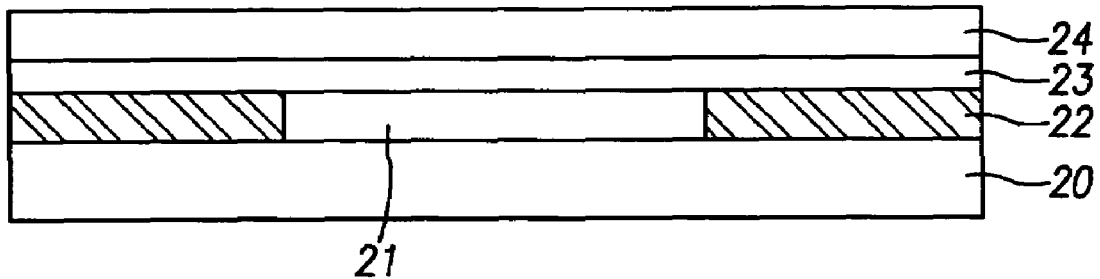

Referring to FIG. 5E, a second interlayer insulating layer 23 and a third interlayer insulating layer 24 are sequentially deposited on the first interlayer insulating layer 21 and the lower copper line 22. The second interlayer insulating layer 23 and the third interlayer insulating layer 24 can be formed of the same material as that of the first interlayer insulating layer 21. An etch stop layer (not shown) can be further formed between the second interlayer insulating layer 23 and the third interlayer insulating layer 24.

Figure 5F:
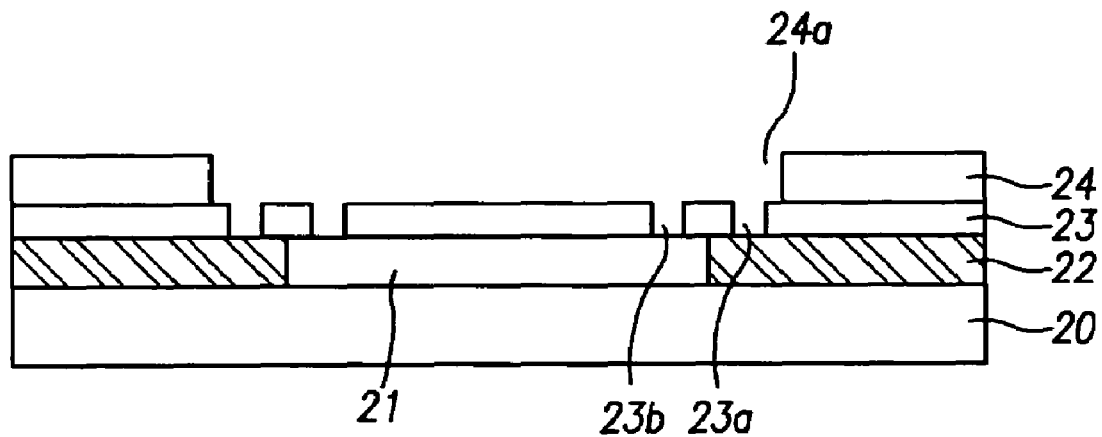

Referring to FIG. 5F, the third interlayer insulating layer 24 is selectively etched to form a second trench 24a within the third interlayer insulating layer 24. Then, the second interlayer insulating layer 23 is selectively etched to form a via hole 23a and a dummy via hole 23b within the second interlayer insulating layer 23. The second trench 24a is a region in which an upper copper line will be formed later, and the via hole 23a and the dummy via hole 23b are regions in which a via contact and a dummy via contact will be formed. Therefore, the via hole 23a partially exposes the lower copper line 22, and the dummy via hole 23b is formed at a location that is adjacent to the via hole 23a and partially exposes the first interlayer insulating layer 21.

Also, in this embodiment, a dummy via hole (not shown) can be formed adjacent to the via hole 23a by selectively etching the second interlayer insulating layer 23 and the first interlayer insulating layer 21, thus partially exposing the lower structure 20.

Figure 5G:
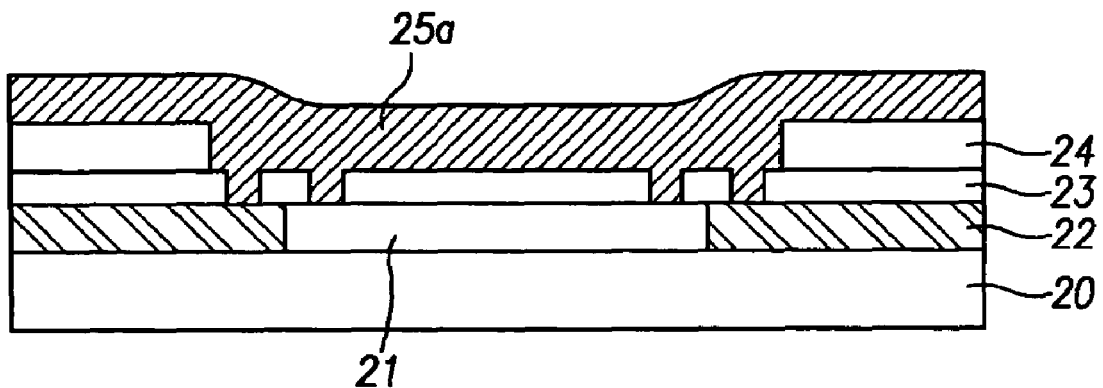

Referring to FIG. 5G, a second copper layer 25a is entirely deposited to fill the via hole 23a, the dummy via hole 23b, and the second trench 24a. The second copper layer 25a can be deposited using electrolytic plating. A diffusion barrier layer (not shown) and a copper seed layer (not shown) can be deposited prior to the deposition of the second copper layer 25a. Also, a thermal treatment can be performed after the deposition of the second copper layer 25a. The diffusion barrier layer can prevent copper from being diffused into the interlayer insulating layer. Due to the second seed layer, the second copper layer 25a can be effectively formed.

In an embodiment, the thermal treatment can performed in vacuum atmosphere to reflow the resulting structure in which the second copper layer 25a is formed. For this purpose, the thermal treatment is performed on the resulting structure at about 350 to about 600° C. for several seconds to tens of minutes, preferably for about 30 to about 180 seconds, under an inert gas atmosphere (for example Ar) in the vacuum atmosphere. The thermal treatment for the reflow should be performed in a state in which a surface oxidation of the second copper layer 25a is maximally suppressed. Accordingly, it is preferable that the thermal treatment be performed in a high vacuum of about 10 torr or less, preferably about 10 to about 6 torr or less. When the thermal treatment is performed on the resulting structure with the second copper layer 25a in the above-described condition, the metal layers move due to the reflow so that the via hole 23a, the dummy via hole 23b, and the second trench 24a are completely filled.

The thermal treatment can be performed after the second copper layer 25a is planarized using a CMP process. As a result of the thermal treatment, it is possible to obtain a completely-planarized upper metal line 26.

Figure 5H:
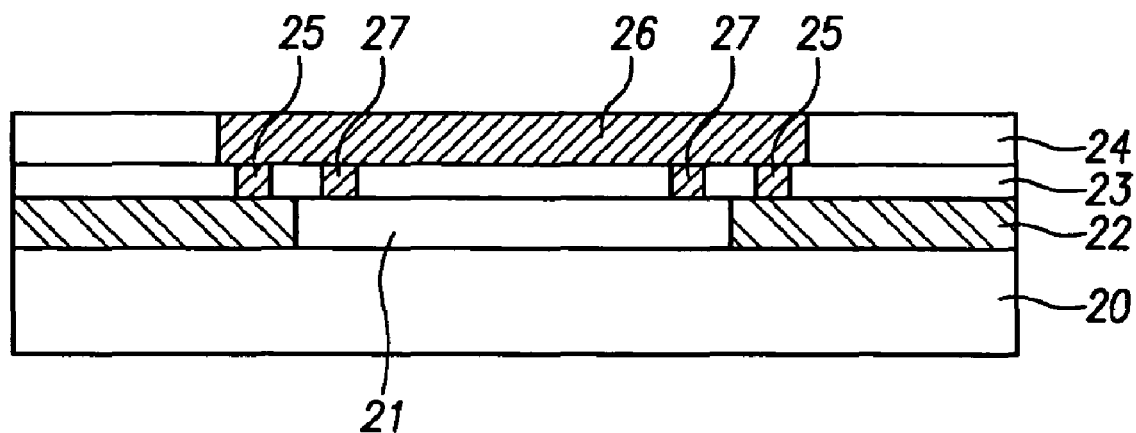

Referring to FIG. 5H, the second copper layer 25a can be planarized using a CMP process to form an upper copper line 26 within the second trench 24a of the third interlayer insulating layer 24. Simultaneously, a via contact 25 and a dummy via contact 27 are formed within the via hole 23a and the dummy via hole 23b of the second interlayer insulating layer 23, respectively.

In the above-described embodiment, the lower copper line 22 is formed using a single damascene process, and the upper copper line 26 and the via contact 25 are formed using a dual damascene process. The dummy via contact 27 and the via contact 25 can be simultaneously formed within the second interlayer insulating layer 23.

The dummy via contact 27 can also be formed in the second interlayer insulating layer 23 and the first interlayer insulating layer 22.

The present invention is not limited to the above-described method and the multi-layered copper line structure can also be formed using other methods.

According to the present invention, a dummy via contact is formed at a location adjacent to a via contact for connecting the upper copper line to the lower copper line. The dummy via contact is electrically connected to the upper copper line, but not to the lower copper line.

Accordingly, unlike the via contact, the dummy via contact reduces the distance between the via contacts, while not performing the electrical function. Consequently, the possibility of a void occurrence can be remarkably reduced. Also, since the dummy via contact is formed closer to one of the two via contacts, the void occurrence can be concentrated around the dummy via contact rather than the via contact.

As described above, the present invention can effectively reduce or prevent the occurrence of voids and open circuits due to the migration of copper atoms, thereby increasing the yield and reliability of the semiconductor devices.

It will be apparent to those skilled in the art that various modifications and variations can be made in the present invention. Thus, it is intended that the present invention covers the modifications and variations of this invention provided they come within the scope of the appended claims and their equivalent.

I claim:

1. A multi-layered copper line structure of a semiconductor device, comprising:
    a lower copper line formed above a lower structure of a semiconductor device;
    an upper copper line formed above the lower copper line;
    a via contact formed between the lower copper line and the upper copper line to electrically connect the lower copper line and the upper copper line; and
    a dummy via contact formed adjacent the via contact, wherein the dummy via contact is connected to the upper copper line but is not connected to the lower copper line,
    wherein the via contact is provided in plurality and the dummy via contact is provided in plurality between the via contacts, wherein the dummy via contacts are formed in a line parallel to a line of the upper copper line.

2. The multi-layered copper line structure according to claim 1, further comprising:
    a first interlayer insulating layer, formed above the lower structure of a semiconductor device, and in which the lower copper line is formed;
    a second interlayer insulating layer, formed above the lower copper line, and in which the via contact is formed; and
    a third interlayer insulating layer, formed above the second interlayer insulating layer, and in which the upper copper line is formed.

3. The multi-layered copper line structure according to claim 2, wherein the first interlayer insulating layer, the second interlayer insulating layer, and the third interlayer insulating layer are formed of material having a dielectric constant of about 3.5 or less.

4. The multi-layered copper line structure according to claim 2, wherein the dummy via contact is formed in the second interlayer insulating layer.

5. The multi-layered copper line structure according to claim 2, wherein the dummy via contact is formed in the first interlayer insulating layer and the second interlayer insulating layer.

6. The multi-layered copper line structure according to claim 2, further comprising
    a diffusion barrier layer on the first interlayer insulating layer; and
    a copper seed layer on the diffusion barrier layer.

7. The multi-layered copper line structure according to claim 1, wherein the via contact is provided in plurality, and at least one dummy via contact is formed close to each of the via contacts while not being connected to the lower copper line.

8. The multi-layered copper line structure according to claim 1, wherein the dummy via contact is further provided in plurality adjacent the via contact, wherein the dummy via contacts are formed in the line parallel to a line of the upper copper line and in the line perpendicular to the line of the copper line.

9. The multi-layered copper line structure according to claim 1, wherein the dummy via contact is formed adjacent the via contact at a location spaced apart from the via contact by about 0.3 µm–about 0.5 µm.

10. A method for forming a multi-layered copper line of a semiconductor device, comprising:
    forming a first interlayer insulating layer above a lower structure;
    forming a lower copper line within the first interlayer insulating layer;
    forming a second interlayer insulating layer above the first interlayer insulating layer and the lower copper line;
    forming at least one via contact and at least one dummy via contact within the second interlayer insulating layer;
    forming a third interlayer insulating layer above the second interlayer insulating layer; and
    forming an upper copper line within the third interlayer insulating layer,
    wherein forming the at least one via contact and at least one dummy via contact within the second interlayer insulating layer, comprises:
        forming a plurality of via contacts and a plurality of dummy contacts, wherein dummy via contacts are formed between via contacts in a line of the upper copper line.

11. The method according to claim 10, wherein forming the lower copper line within the first interlayer insulating layer comprises:
    depositing a diffusion barrier layer on the first interlayer insulating layer;
    depositing a copper seed layer on the diffusion barrier layer; and
    forming a first copper layer.

12. The method according to claim 11, further comprising performing a thermal treatment after the forming the first copper layer.

13. The method according to claim 10, wherein the at least one via contact is connected to the lower copper line, and the at least one dummy via contact is formed adjacent to the at least one via contact and within the second interlayer insulating layer and the first interlayer insulating layer.

14. The method according to claim 10, wherein the upper copper line is formed contacting the at least one via contact and the at least one dummy via contact.

15. The method according to claim 10, wherein forming the upper copper line within the third interlayer insulating layer, comprises:
    depositing a diffusion barrier layer and a copper seed layer on the second interlayer insulating layer and the third interlayer insulating layer; and forming a second copper layer,
wherein forming the second copper layer fills the at least one via contact, the at least one dummy via contact, and the upper copper line.

16. The method according to claim 15, further comprising performing a thermal treatment after forming the second copper layer.

17. The method according to claim 10, wherein the first interlayer insulating layer, the second interlayer insulating layer, and the third interlayer insulating layer are formed of material having a dielectric constant of about 3.5 or less.

18. The method according to claim 10, wherein forming the at least one via contact and at least one dummy via contact within the second interlayer insulating layer, further comprises:
forming a second plurality of dummy contacts adjacent the at least one via contact, wherein the second plurality of dummy contacts adjacent the at least one via contact a formed in a line perpendicular to the line of the upper copper line.

* * * * *

UNITED STATES PATENT AND TRADEMARK OFFICE
CERTIFICATE OF CORRECTION

PATENT NO. : 7,459,787 B2 Page 1 of 1
APPLICATION NO. : 11/433037
DATED : December 2, 2008
INVENTOR(S) : Tae Young Lee It is certified that error appears in the above-identified patent and that said Letters Patent is hereby corrected as shown below:

Title Page should read
Item (12) & (75),
Inventor, "Lee Tae Young" should read --Tae Young Lee--.

Signed and Sealed this

Seventh Day of April, 2009

JOHN DOLL
*Acting Director of the United States Patent and Trademark Office*